(12) United States Patent
Kang et al.

(10) Patent No.: US 8,765,521 B2
(45) Date of Patent: Jul. 1, 2014

(54) VARIABLE RESISTANCE MEMORY DEVICES AND METHODS OF MANUFACTURING THE SAME

(71) Applicant: Samsung Electronics Co., Ltd., Suwon-Si (KR)

(72) Inventors: Myung Jin Kang, Yongin-si (KR); Youngnam Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/143,760

(22) Filed: Dec. 30, 2013

(65) Prior Publication Data

US 2014/0113429 A1    Apr. 24, 2014

Related U.S. Application Data

(62) Division of application No. 13/369,662, filed on Feb. 9, 2012, now Pat. No. 8,653,493.

(30) Foreign Application Priority Data

Feb. 23, 2011    (KR) .......................... 10-2011-0016100

(51) Int. Cl.
*H01L 29/02*    (2006.01)

(52) U.S. Cl.
USPC ............... 438/102; 438/103; 438/104; 257/2; 257/3; 257/4; 257/5; 257/E29.002

(58) Field of Classification Search
USPC .................. 257/1–5, E29.002; 438/102–104; 365/163
See application file for complete search history.

(56) References Cited

U.S. PATENT DOCUMENTS

| | | |
|---|---|---|
| 7,625,777 B2 * | 12/2009 | Lee et al. ...................... 438/102 |
| 2006/0091492 A1 | 5/2006 | Lee et al. |
| 2006/0097341 A1 | 5/2006 | Pellizzer et al. |
| 2011/0220858 A1 | 9/2011 | Hwang et al. |

FOREIGN PATENT DOCUMENTS

| | | |
|---|---|---|
| KR | 2006-0065919 A | 6/2006 |
| KR | 2007-0069768 A | 7/2007 |
| KR | 10-0833505 B1 | 5/2008 |

\* cited by examiner

*Primary Examiner* — Jami M Valentine

(74) *Attorney, Agent, or Firm* — Harness, Dickey & Pierce, P.L.C.

(57) ABSTRACT

According to example embodiments, a variable resistance memory device include an ohmic pattern on a substrate; a first electrode pattern including a first portion that has a plate shape and contacts a top surface of the ohmic pattern and a second portion that extends from one end of the first portion to a top; a variable resistance pattern electrically connected to the first electrode pattern; and a second electrode pattern electrically connected to the variable resistance pattern, wherein one end of the ohmic pattern and the other end of the first portion are disposed on the same plane.

11 Claims, 23 Drawing Sheets

VARIABLE RESISTANCE MEMORY DEVICES AND METHODS OF MANUFACTURING THE SAME

CROSS-REFERENCE TO RELATED APPLICATIONS

This application is a divisional application of U.S. application Ser. No. 13/369,662, filed Feb. 9, 2012, which claims priority under 35 U.S.C. §119 to the benefit of Korean Patent Application No. 10-2011-0016100, filed on Feb. 23, 2011, the entire contents of which are hereby incorporated by reference.

BACKGROUND

Example embodiments relate to a semiconductor memory device and/or a method of manufacturing the same, and more particularly, to a variable resistance memory device and/or a method of manufacturing the same.

In order to achieve high performance and low power consumption, next generation semiconductor memory devices such as Ferroelectric Random Access Memory (FRAM), Magnetic Random Access Memory (MRAM), and Phase-change Random Access Memory (PRAM) are under development. Materials constituting the next generation semiconductor devices have varying resistance values according current or voltage and retain their resistance values even if current or voltage is not applied anymore.

Among the variable resistance memory devices, the PRAM using a phase-change material may include a fast operating speed and a structure appropriate for the high degree of integration. Thus, the PRAM is continuously being developed.

SUMMARY

Example embodiments relate to a variable resistance memory device with improved electrical characteristics and reliability.

Example embodiments relate to a method of manufacturing a variable resistance memory device.

According to example embodiments, a variable resistance memory device includes an ohmic pattern on a substrate, a select device between the ohmic pattern and the substrate, a first electrode pattern including a first portion and a second portion, a variable resistance pattern electrically connected to the first electrode pattern, and a second electrode pattern electrically connected to the variable resistance pattern. The first portion of the first electrode pattern may include a plate shape and contact a top surface of the ohmic pattern. The second portion of the first electrode pattern may extend vertically from one end of the first portion of the first electrode pattern. One end of the ohmic pattern and the other end of the first portion may be on the same plane.

The other end of the first portion of the first electrode pattern may face the one end of the first portion of the first electrode pattern.

The variable resistance memories may further include a first spacer on the first portion of the first electrode pattern. The first spacer may include one end contacting the second portion of the first electrode pattern. The other end of the first spacer may be on the ohmic pattern.

The ohmic pattern may cover a top surface of the select device.

A width of the ohmic pattern may be greater or equal than a width of the select device.

The variable resistance memory device may further include a conductive pattern between the select device and the ohmic pattern. The conductive pattern may include a metal semiconductor compound.

A width of the first portion of the first electrode pattern may be less than a width of the ohmic pattern. The first portion of the first electrode pattern may expose a portion of the ohmic pattern.

The variable resistance memory device may further include a second spacer contacting the top surface of the ohmic pattern and on a side of the second portion of the first electrode pattern.

The second spacer may include one end contacting a side of the second portion of the first electrode pattern. The device may further include a third spacer. The first spacer may be between the third spacer and the second spacer.

According to example embodiments of inventive concepts, a memory card may include the foregoing variable resistance memory device and a memory controller for providing data exchange between a host and the variable resistance memory device. The memory controller may include a CPU connected to an operating memory, a host interface, a memory interface, and a bus connecting the CPU, host interface, and memory interface.

According to example embodiments of inventive concepts, an information processing system may include the foregoing variable resistance memory device, and a memory controller operatively connected to the variable resistance memory device.

According to example embodiments of the inventive concepts, a method of manufacturing a variable resistance memory device may include forming an ohmic layer on a substrate, forming a sacrificial pattern on the ohmic layer, forming a preliminary first electrode pattern including a first portion and a second portion, the second portion of the preliminary first electrode pattern contacting a sidewall of the sacrificial pattern, forming a preliminary ohmic pattern by removing a portion of the ohmic layer exposed by the sacrificial pattern and the preliminary first electrode pattern, exposing a sidewall of the preliminary first electrode pattern by removing the sacrificial pattern. The first portion of the preliminary first electrode pattern may contact the preliminary ohmic pattern. The method may further include forming a preliminary first spacer pattern on a sidewall of the preliminary first electrode pattern, forming an ohmic pattern by etching the preliminary ohmic pattern, and forming a variable resistance pattern and a second electrode pattern on the ohmic pattern.

The method may further include forming an insulation layer on the substrate. The insulation layer may have a hole that exposes a top of the substrate. The method may further include forming a first semiconductor pattern doped with a first impurity having a first conductive type to partially fill the hole, forming a second semiconductor pattern on the first semiconductor pattern to completely fill the hole. The second semiconductor pattern may be doped with a second impurity of a second conductive type that is different from the first conductive type. The method may further include forming a metal layer on the second semiconductor pattern and the insulation layer, and thermally treating the second semiconductor pattern and the metal layer to transform a top of the second semiconductor pattern contacting the metal layer into a conductive pattern that includes a metal semiconductor compound.

The forming of the preliminary first electrode pattern may include conformally forming a first electrode layer on the ohmic layer and the sacrificial pattern, forming a preliminary second spacer pattern on a sidewall of the sacrificial pattern having the first electrode layer, and forming the preliminary first electrode pattern by etching the first electrode layer with the preliminary second spacer pattern used as an etch mask, The preliminary second spacer pattern may be formed to cover a top of the conductive pattern formed at a bottom of the first electrode pattern.

The preliminary first spacer pattern may be formed to cover a top of a conductive pattern formed at a bottom of the preliminary ohmic pattern.

The sacrificial pattern may be formed of a material having an etch selectivity with respect to the first spacer and the first electrode pattern when an etchant is used.

The ohmic layer may be formed by sequentially stacking a metal layer and a metal compound layer.

According to example embodiments, a method of manufacturing a variable resistance memory device may include forming an ohmic layer connected to at least one word line, forming at least one sacrificial pattern on the ohmic layer, forming a first electrode layer on the at least one sacrificial pattern and the ohmic layer, forming at least one preliminary first spacer pattern on the first electrode layer and the ohmic layer, forming at least one ohmic pattern, and forming at least one variable resistance pattern and at least one second electrode pattern on the at least one ohmic pattern. The forming at least one ohmic pattern may include removing a first portion of the ohmic layer using at least the at least one preliminary first spacer pattern as a mask, and removing a second portion of the ohmic layer under the lat least one sacrificial pattern.

The forming at least one preliminary first spacer pattern may form the at least one preliminary first spacer pattern so the first electrode layer is between the at least one sacrificial pattern and the at least one preliminary first spacer pattern, and the first electrode layer is between the ohmic layer and the at least one preliminary first spacer pattern.

The forming an ohmic layer connected to at least one word line may include forming at least one select device on the at least one word line, and forming the ohmic layer on the at least one select device.

The forming at least one ohmic pattern may further include forming at least one preliminary first electrode pattern by removing an exposed portion of the first electrode layer. The removing the second portion of the ohmic layer under the at least one sacrificial pattern may include removing the at least one sacrificial pattern, forming at least one preliminary second spacer pattern on a sidewall of the preliminary first electrode pattern, and removing the second portion of the ohmic layer using at least the at least one preliminary second spacer pattern as a mask.

The forming at least one ohmic pattern may further include removing a third portion of the ohmic layer.

BRIEF DESCRIPTION OF THE DRAWINGS

The foregoing and other features and advantages of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF THE EMBODIMENTS

Figure 1:
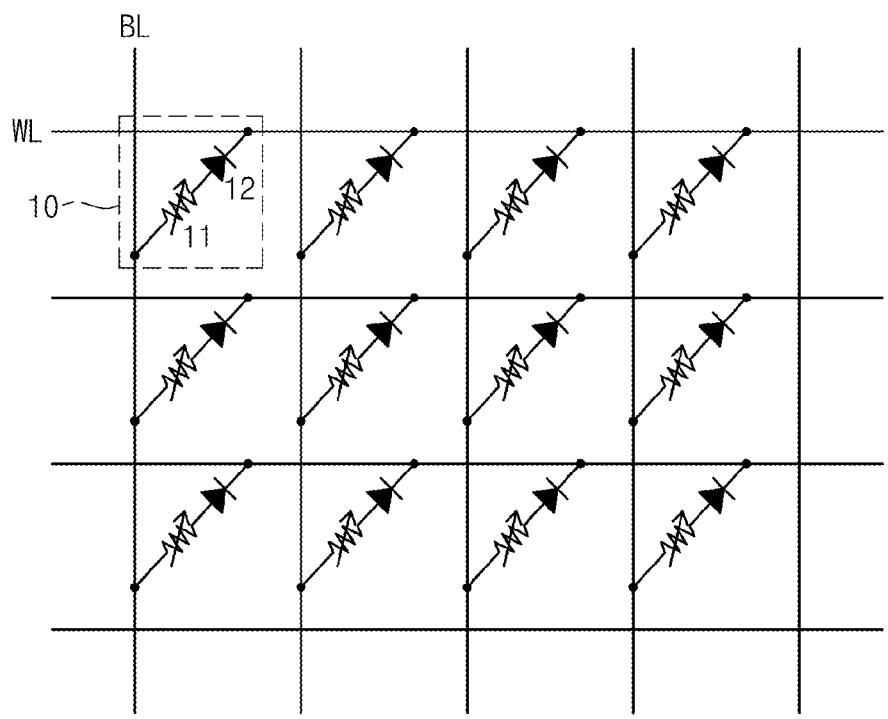
FIG. 1 is a circuit diagram illustrating a memory cell array of a variable resistance memory device according to example embodiments of the inventive concepts.
Figure 1:
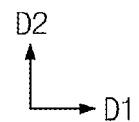

Example embodiments of the inventive concepts will now be described below in more detail with reference to the accompanying drawings, in which some example embodiments are shown. Example embodiments may, however, be embodied in different forms and should not be construed as limited to the embodiments set forth herein. Rather, these embodiments are provided so that this disclosure will be thorough and complete, and will fully convey the scope of inventive concepts to those of ordinary skill in the art. In the drawings, the thickness of layers and regions are exaggerated for clarity. In the figures, the dimensions of layers and regions may be exaggerated for clarity of illustration. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). Further, it will be understood that when a layer is referred to as being 'under' another layer, it can be directly under, and one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments. For example, an etched region illustrated as a rectangle may have rounded or curved features.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

(Variable Resistance Memory Device)

FIG. 1 is a circuit diagram illustrating a memory cell array 50 of a variable resistance memory device according to example embodiments of the inventive concepts.

Referring to FIG. 1, a plurality of memory cells 10 are arranged in a matrix. Each of the memory cells 10 includes a variable resistance pattern 11 and a select device 12. The variable resistance pattern 11 may be connected between a bit line BL and the select device 12 and the select device 12 may be connected between the variable resistance pattern 11 and a word line WL.

The variable resistance pattern 11 may include phase-change materials, ferroelectric materials, or magnetic materials. The variable resistance pattern 11 may have a status determined according to an amount of current supplied through the bit line BL. The status determined according to an amount of current supplied through the bit line BL may be related to whether the variable resistance pattern 11 is in a crystalline or non-crystalline status, and/or high-resistance or low-resistance state, but example embodiments are not limited thereto.

The select device 12 may be connected to the variable resistance pattern 11 and the word line WL. A current supply to the variable resistance pattern 11 may be controlled according to a voltage of the word line WL. Although FIG. 1 illustrates a diode is used as the select device 12, example embodiments are not limited thereto. For example, a transistor such as a Metal Oxide Semiconductor (MOS) transistor or a bipolar transistor may be used as the select device 12.

From now, according to example embodiments of inventive concepts, a variable resistance memory device including memory cells formed of phase change materials as the variable resistance pattern 11 will be described. However, it is apparent that the technical ideas of example embodiments of inventive concepts are not limited thereto and thus may be applied to Resistance Random Access Memory (RRAM), Ferroelectric RAM (FRAM), and Magnetic RAM (MRAM).

According to example embodiments of the inventive concepts, the phase change material (i.e., the variable resistance pattern 11) may have a resistance changed according to temperature. That is, the phase change material may have an amorphous state of a relatively high resistance and a crystal state of a relatively low resistance, according to temperature and cooling time. In the variable resistance pattern 11, Joule's heat may be generated according to an amount of current supplied through a lower electrode, thereby heating the phase change material. At this point, Joule's heat may be generated in proportion to a resistivity of a phase change material and a supplying time of current.

Figure 2A:
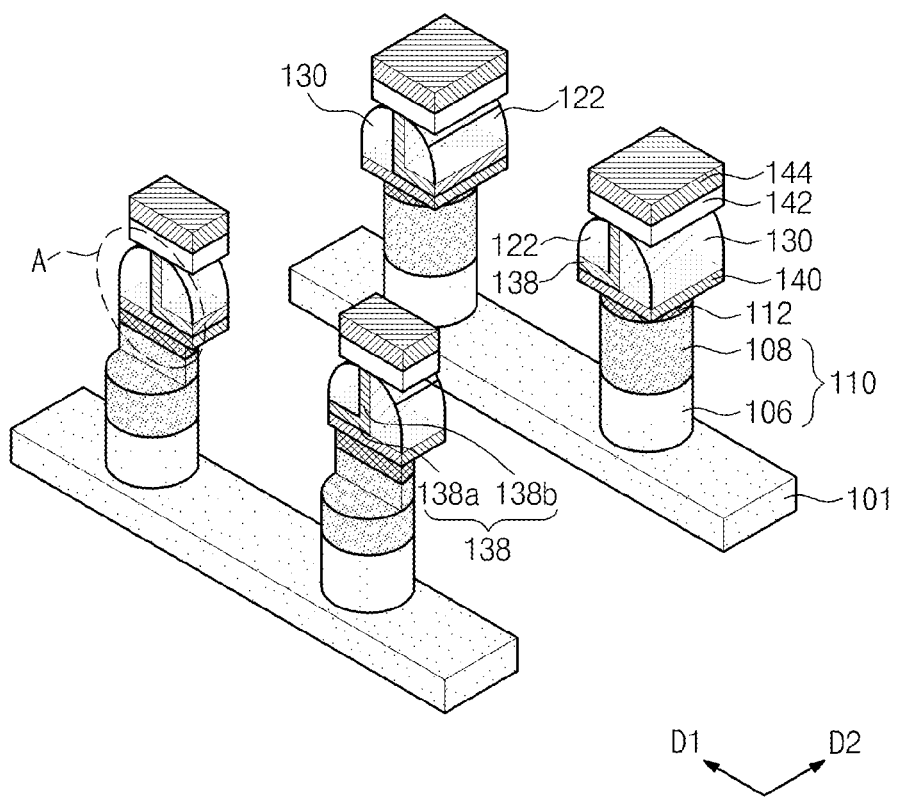
FIG. 2A is a perspective view illustrating a variable resistance memory device according to example embodiments of the inventive concepts.
Figure 2B:
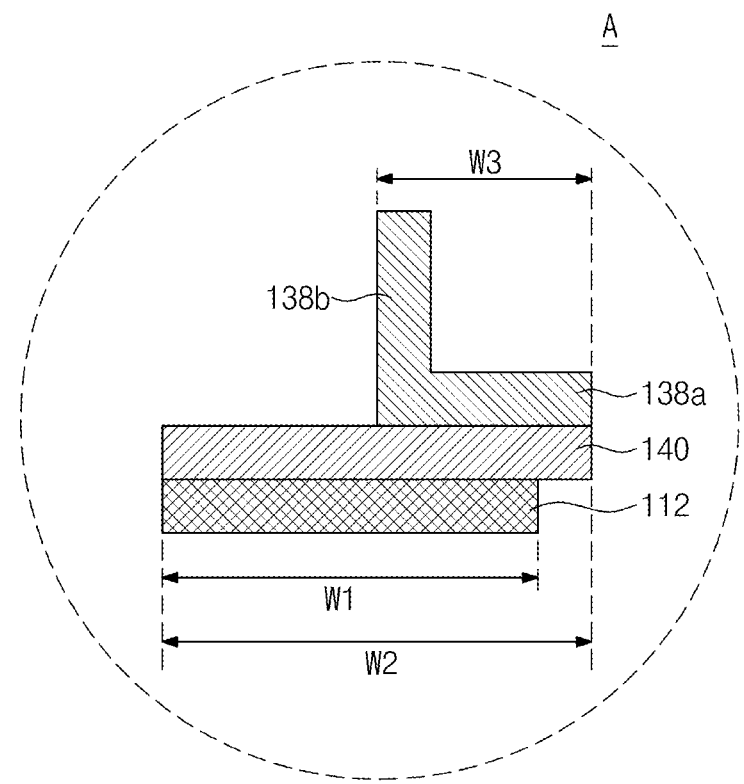
FIG. 2B is a partial enlarged sectional view illustrating a variable resistance memory device according to example embodiments of the inventive concepts.

FIG. 2A is a perspective view illustrating a variable resistance memory device according to example embodiments of inventive concepts. FIG. 2B is a partial enlarged sectional view illustrating a variable resistance memory device according to example embodiments of the inventive concepts. FIG. 2B is an enlarged sectional view of a portion A of FIG. 2A.

Referring to FIGS. 2A and 2B, the variable resistance device may include a word line 101 in a substrate (not shown), a select device 110, a conductive pattern 112, an ohmic pattern 140, first electrode patterns 138, a variable resistance pattern 142, and a second electrode pattern 144.

The word line 101 may have a line form extending in a first direction D1. For example, the word line 101 may be formed of a semiconductor doped with an impurity such as silicon doped with an impurity, a metal, or a metal compound, but example embodiments are not limited thereto.

The variable resistance device may include a plurality of word lines 101. The plurality of word lines 101 may be laterally spaced from each other in a second direction D2 perpendicular to the first direction D1.

The select device 110 may be electrically connected to the word line 101. According to example embodiments of inventive concepts, the bottom surface of the select device 110 may contact the top surface of the word line 101. Additionally, variable resistance device may include a plurality of the select devices 110. The plurality of select devices 110 may be spaced from each other on the word line 101 in the first direction D1.

The select device 110 may be a diode including a first semiconductor pattern 106 doped with a first conductive impurity and a second semiconductor pattern 108 doped with a second conductive impurity. The second conductive impurity may be different than the first conductive impurity are stacked. The second semiconductor pattern 108 may be stacked on the first semiconductor pattern 106. While FIG. 2 illustrates a select device 110 in the form of a diode, example embodiments are not limited thereto. For example, a transistor such as a Metal Oxide Semiconductor (MOS) transistor or a bipolar transistor may be used as the select device.

The select device 110 may have a first width W1 in a horizontal section of the select device 110.

The conductive pattern 112 may be disposed on the select device 110. According to example embodiments of inventive concepts, when the select device 110 includes silicon and the ohmic pattern 140 includes a metal and/or a metal compound, the conductive pattern 112 may more effectively connect between the select device 110 and the ohmic pattern 140 electrically.

The conductive pattern 112 may include a metal silicide, for example titanium silicide (TiSi), cobalt silicide (CoSi) or nickel silicide (NiSi), but example embodiments are not limited thereto.

According to example embodiments of inventive concepts, the conductive pattern 112 may have the first width W1 in the horizontal section of the conductive pattern 112. Additionally, the section of the conductive pattern 112 has the same or substantially the same shape as that of the select device 110 and thus may have the first width W1.

The ohmic pattern 140 may be disposed on the conductive pattern 112. The ohmic pattern 140 may be formed by stacking a metal layer and a metal compound layer. For example, the ohmic pattern 140 may be formed by stacking a titanium titanium-nitride layer (Ti—TiN), a titanium titanium-aluminum-nitride layer (Ti—TiAlN), a tantalum tantalum-nitride, but example embodiments are not limited thereto.

The ohmic pattern 140 may have a plate shape, but example embodiments are not limited thereto. Additionally, the ohmic pattern 140 may have a second width W2 in a section taken along a horizontal direction of the ohmic pattern 140. The second width W2 may be substantially identical to or greater than the first width W1.

According to example embodiments of the inventive concepts, the ohmic pattern 140 completely covers the conductive pattern 112 and may extend in the first direction D1. For example, one end of the ohmic pattern 140 and one end of the conductive pattern 112 may be disposed and/or substantially disposed along the same plane.

The first electrode patterns 138 may include a first portion 138a having a plate shape that contacts the ohmic pattern 140 and a second portion 138b extending from one end of the first portion 138a to the top. The first electrode patterns 138 may have an 'L' shape and/or a minor image of 'L', but example embodiments are not limited thereto. A first spacer 122 may contact the first portion 138a of each first electrode pattern 138.

According to example embodiments of inventive concepts, the first portion 138a may have a third width W3 in a horizontal section of the first portion 138a in the first electrode patterns 138. The third width W3 may be less and/or substantially less than the second width W2.

According to example embodiments, the other end of the first portion 138a in the first electrode patterns 138 and the other end of the ohmic pattern 140 may be substantially disposed along the same plane. Additionally, one end of the first portion 138a in the first electrode patterns 138 may be disposed on the ohmic pattern 140.

The first electrode patterns 138 may include semiconductor doped with an impurity (e.g., silicon doped with an impurity), a metal, or a metal compound, but example embodiments are not limited thereto. For example, the first electrode patterns 138 may include a titanium nitride (TiN), a tantalum nitride (TaN), or a titanium carbide (TiC), but example embodiments are not limited thereto.

The variable resistance pattern 142 may be electrically connected to the first electrode patterns 138. As one example, the variable resistance pattern 142 may directly contact the first electrode patterns 138. As another example, the variable resistance pattern 142 may be electrically connected to the first electrode patterns 138 through a pattern including a conductive material.

The variable resistance pattern may be formed of a compound including at least two of Te, Se, Ge, Sb, Bi, Pb, Sn, Ag, As, S, Si, P, O, and C, but example embodiments are not limited thereto.

The second electrode pattern 144 may be electrically connected to the variable resistance pattern 142. As one example, the second electrode pattern 144 may directly contact the variable resistance pattern 142. As another example, the second electrode pattern 144 may be electrically connected to the variable resistance pattern 142 through a pattern including a conductive material. The second electrode pattern 144 may include a metal or a metal compound. For example, the second electrode pattern 144 may include one of Ti, $TiSi_x$, TiN, TiON, TiW, TiAlN, TiAlON, TiSiN, TiBN, W, $WSi_x$, WN, WON, WSiN, WBN, WCN Ta, $TaSi_x$, TaN, TaON, TaAlN, TaSiN, TaCN, Mo, MoN, MoSiN, MoAlN, NbN, ZrSiN, ZrAlN, Ru, CoSi, NiSi, a conductive C group, Cu, and combinations thereof.

Although not illustrated in detail, the variable resistance device may further include a bit line (not shown) extending in the second direction D2 on the second electrode pattern 144. The bit line may extend in a perpendicular direction to the word line 101.

(Method of Manufacturing Variable Resistance Memory Device)

FIGS. 3 through 20 are perspective views illustrating a method of manufacturing a variable resistance memory device according to example embodiments of inventive concepts.

Figure 3:
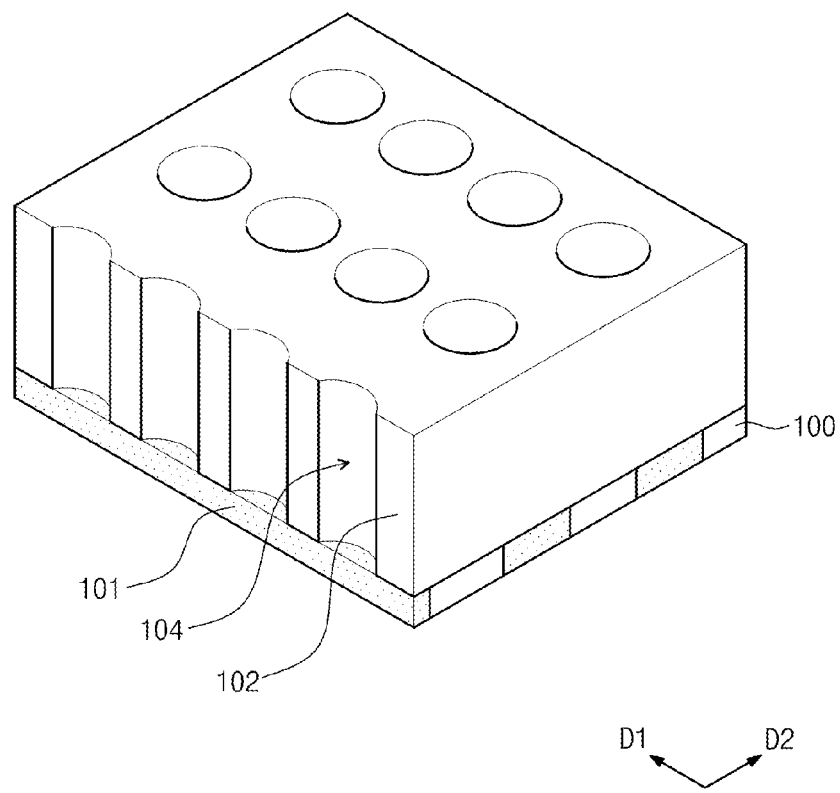
FIGS. 3 through 20 are perspective views illustrating a method of manufacturing a variable resistance memory device according to example embodiments of the inventive concepts.

Referring to FIG. 3, a word line 101 may be formed in a substrate 100 and a first insulation layer 102 including holes 104 that partially expose the word line 101 may be formed on the substrate 100.

The substrate 100 may be a semiconductor substrate including silicon or germanium, but example embodiments are not limited thereto. According to example embodiments of inventive concepts, the word line 101 having a line shape extending in a first direction D1 may be formed by injecting an impurity in the substrate 100. Alternatively, the word line 101 may be formed by etching the substrate 100 and then filling the etched portion of the substrate 100 with a conductive material.

According to example embodiments of inventive concepts, a plurality of word lines 101 may be formed in the substrate. The plurality of word lines 101 may be formed to be spaced from each other in a second direction D2.

A first insulation layer 102 may be formed on the substrate 100 having the word line 101. The first insulation layer 102 may include an oxide, a nitride, or an oxynitride, but examples are not limited thereto. For example, the first insulation layer 102 may include a one of silicon oxide, a silicon nitride, and a silicon oxynitride, but example embodiments are not limited thereto.

The hoes 104 exposing the top of the word line 101 may be formed by etching the first insulation layer 102. The holes 104 may be formed to be spaced from each other in the first direction D1. The etching process may include a plasma etching process, a laser ablation process, a wet etching process, but example embodiments are not limited thereto.

Figure 4:
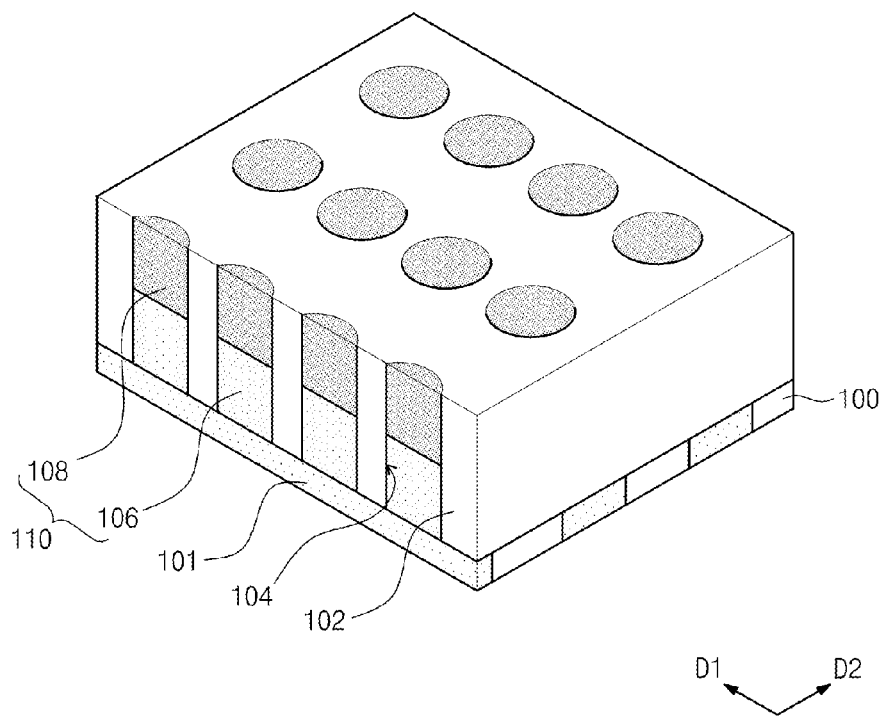

Referring to FIG. 4, a select device 110 may be formed in each of the holes 104.

A first semiconductor pattern 106 doped with a first conductive impurity and electrically connected to the word line 101 may be formed in each of the holes 104. At this point, the first semiconductor pattern 106 may not completely fill each of the holes 104. A second semiconductor pattern 108 doped with a different second conductive impurity than the first conductive impurity may be formed on the first semiconductor pattern 106. The second semiconductor pattern 108 may completely fill each of the holes 104. As one example, the first and second semiconductor patterns 106 and 108 may be formed by growing single crystal silicon or amorphous silicon in the holes 104, but example embodiments are not limited thereto. As another example, the first and second semiconductor patterns 106 and 108 may be formed by depositing and planarizing single crystal silicon or amorphous silicon, but example embodiments are not limited thereto.

Although FIG. 4 illustrates the select device 110 may be a diode including the first semiconductor pattern 106 and the second semiconductor pattern 108, example embodiments are not limited thereto.

Figure 5:
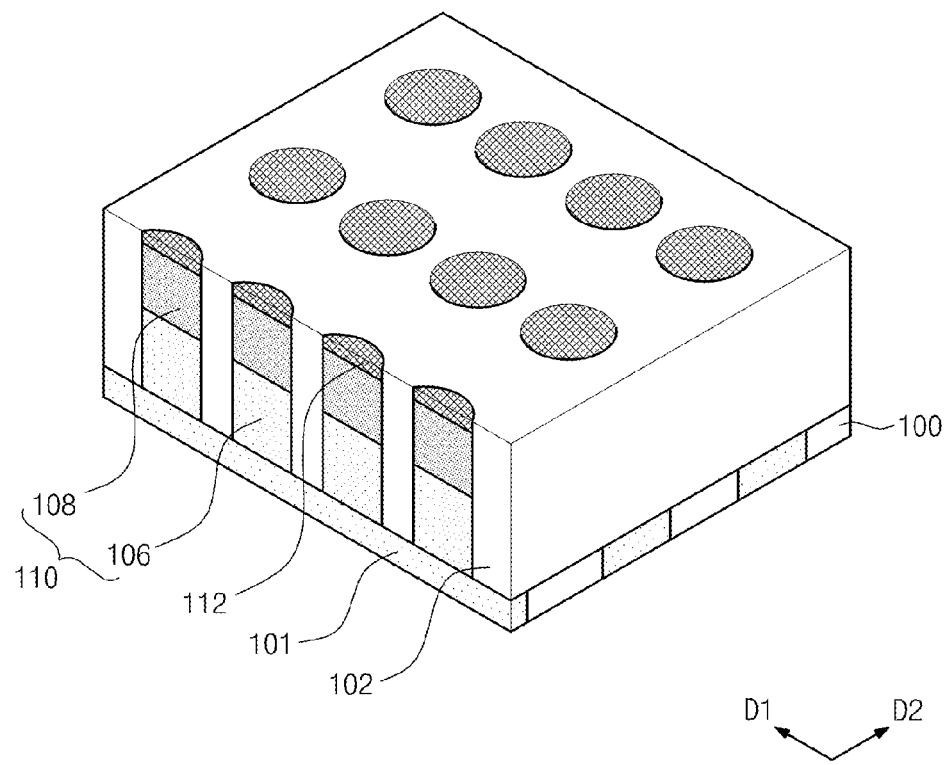

Referring to FIG. 5, the top of the second semiconductor pattern 108 may be transformed into a conductive pattern 112.

As described in more detail, a metal layer (not shown) may be formed on the first insulation layer 102. The metal layer may include Ti, Co, or Ni, but example embodiments are not limited thereto. The top of the second semiconductor pattern 108 adjacent to the metal layer may be transformed into the conductive pattern 112 formed of metal silicide by thermally treating the first insulation layer 102 having the metal layer. Then, the remaining metal layer may be removed.

The conductive pattern 112 may include TiSi, CoSi, or NiSi, but example embodiments are not limited thereto.

Figure 6:
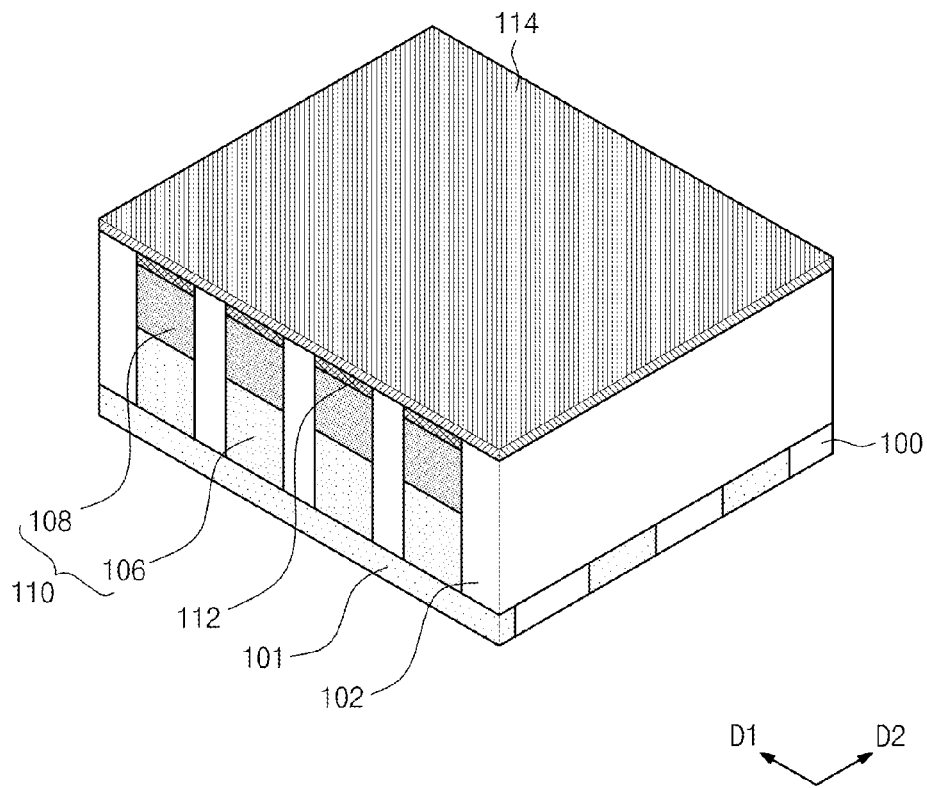

Referring to FIG. 6, an ohmic layer 114 may be formed on the first insulation layer 102.

The ohmic layer 114 may be formed through a physical vapor deposition process or a chemical vapor deposition process, but example embodiments are not limited thereto. The ohmic layer 114 may be formed by stacking a metal layer and a metal compound layer. For example, the ohmic layer 114 may be formed by stacking a titanium layer-titanium nitride layer.

Figure 7:
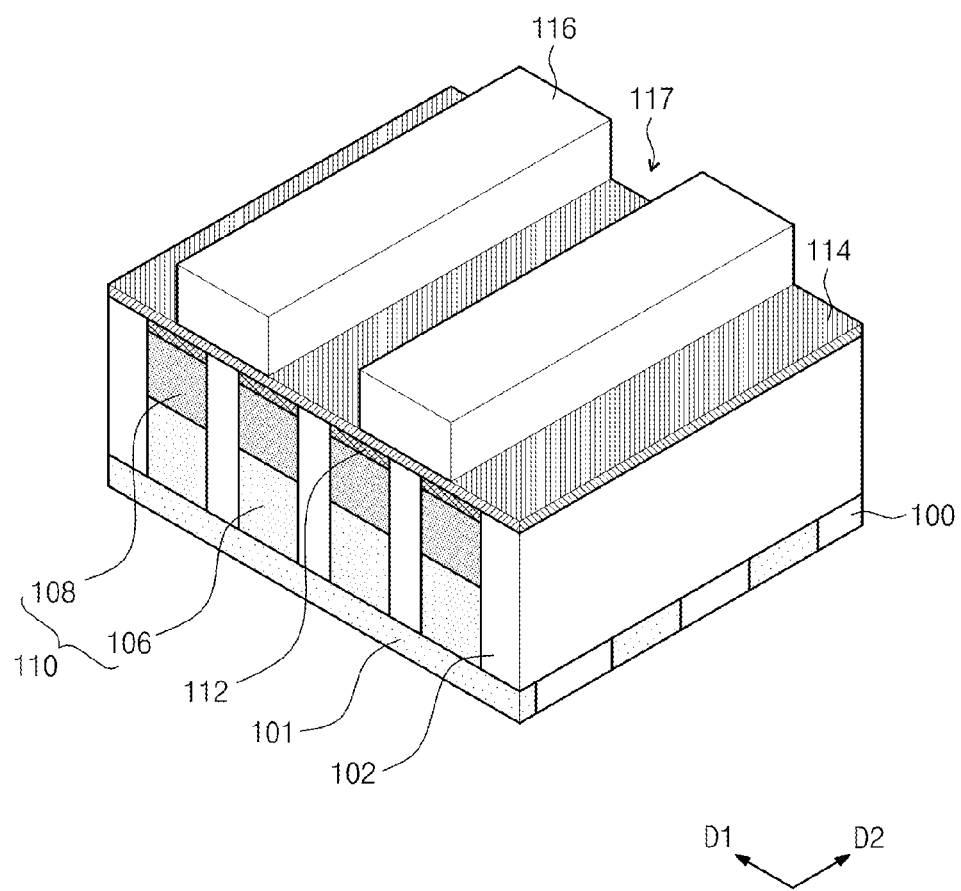

Referring to FIG. 7, a sacrificial pattern 116 having a line shape extending in the second direction D2 may be formed on the ohmic layer 114.

According to example embodiments of inventive concepts, the sacrificial pattern 116 may be formed to partially cover at least a portion of the two select devices 110 adjacent in the first direction D1. For example, the sacrificial layer may include a silicon oxide (SiO), an aluminum oxide ($Al_2O_3$), or a silicon oxynitride (SiON), but example embodiments are not limited thereto.

According to example embodiments of inventive concepts, a plurality of sacrificial patterns 116 may be formed to be spaced from each other in the first direction D1.

Figure 8:
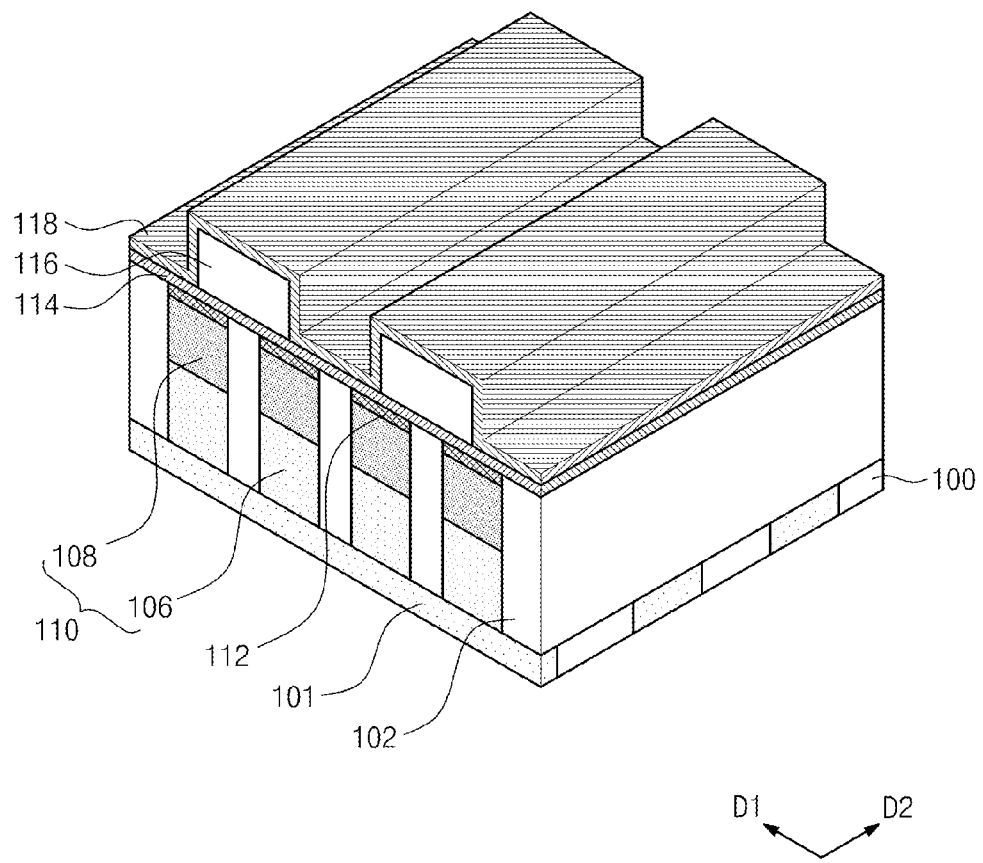

Referring to FIG. 8, a first electrode layer 118 may be conformally formed on the sacrificial pattern 116 and the ohmic layer 114.

The first electrode layer 118 may be continuously formed with the substantially same thickness along the surface profiles of the sacrificial pattern 116 and the ohmic layer 114. If the sacrificial pattern 116 is in plurality, the first electrode layer 118 may not to fill between (i.e., 117 of FIG. 7) the sacrificial patterns 116.

The first electrode layer 118 may include silicon doped with an impurity, a metal, or a metal compound, but example embodiments are not limited thereto. For example, the first electrode layer 118 may include TiN, TaN, or TiC.

The sacrificial pattern 116 may be formed of a material having an etch selectivity with respect to the first electrode layer 118 when an etchant is used. This will be described in more detail below.

Figure 9:
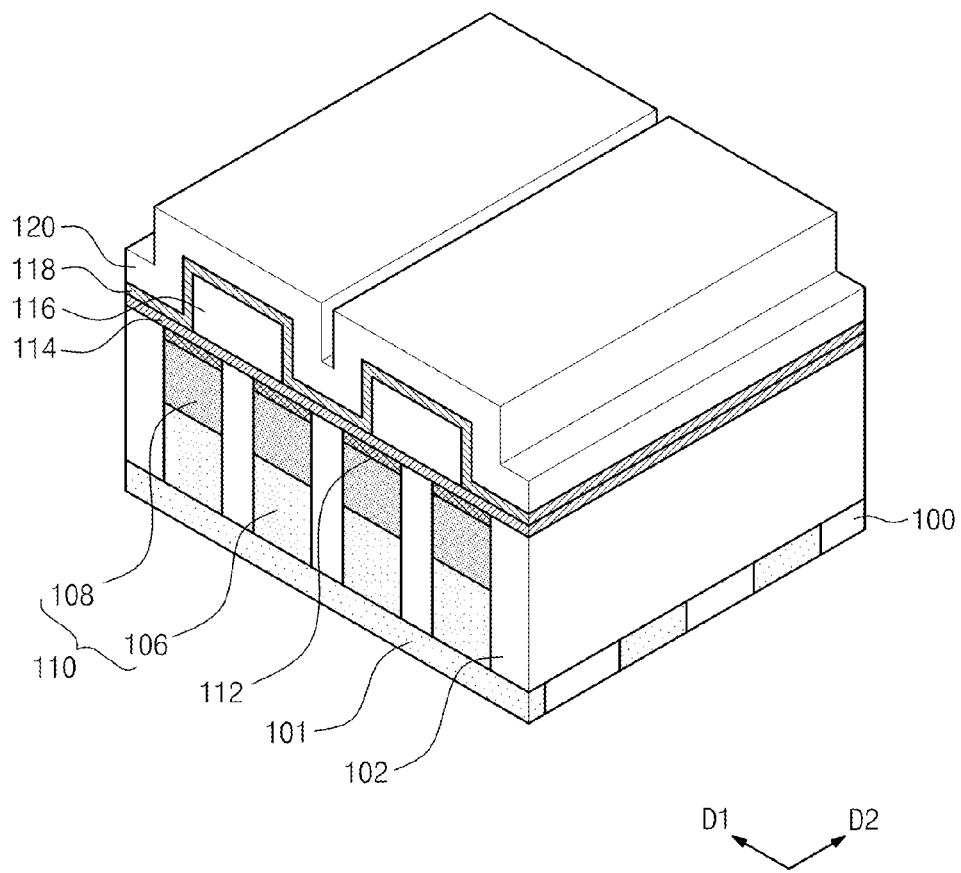

Referring to FIG. 9, a first spacer layer 120 may be conformally formed on the first electrode layer 118.

The first spacer layer 120 may be continuously formed to have the substantially same thickness along the surface profile of the first electrode layer 118. If the sacrificial pattern 116 is in plurality, the first spacer layer 120 may be formed not to fill between (i.e., 117 of FIG. 7) the sacrificial patterns 116 having the first electrode layer 118.

According to example embodiments of inventive concepts, the first spacer layer 120 may be formed of an etch selectivity with respect to the sacrificial pattern 116 when the etchant is used. For example, if the sacrificial pattern 116 includes an oxide, the first spacer layer 120 may include a nitride. For example, the first spacer layer 120 may include a SiN, but example embodiments are not limited thereto.

Figure 10:
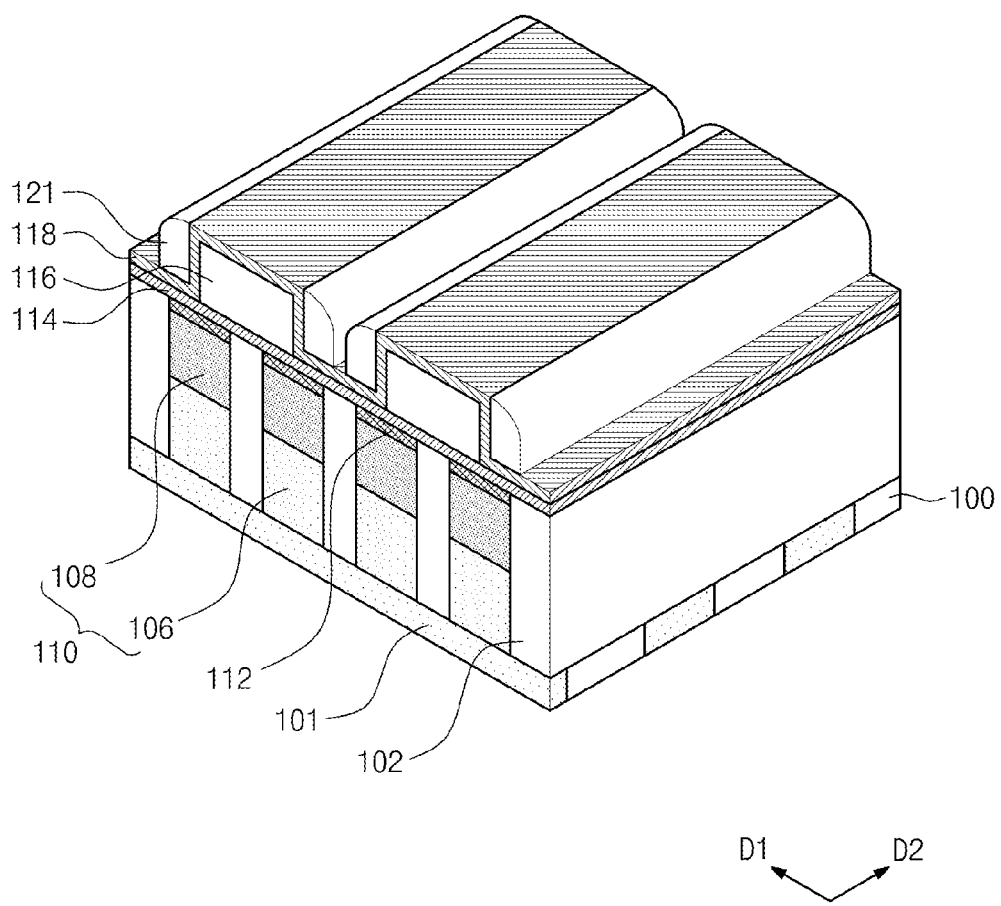

Referring to FIG. 10, a preliminary first spacer pattern 121 exposing the first electrode layer 118 partially may be formed by anisotropically etching the first spacer layer 120.

As described in more detail, if the first spacer layer 120 is anisotropically etched, while the first spacer layer 120 on the first electrode layer 118 on the sacrificial pattern 116 and the first spacer layer 120 on the first electrode layer 118 contacting the ohmic layer 114 are etched, the first spacer layer 120 on the first electrode layer 118 on a sidewall of the sacrificial pattern 116 may not be substantially etched. Accordingly, the preliminary firs spacer pattern 121 may be formed on the first electrode layer 118 on the sidewall of the sacrificial pattern 116.

As shown in the drawings, the first electrode layer 118 on the ohmic layer 114 and the first electrode layer 118 on the sacrificial pattern 116 may be exposed by the preliminary first spacer pattern 121.

Figure 11:
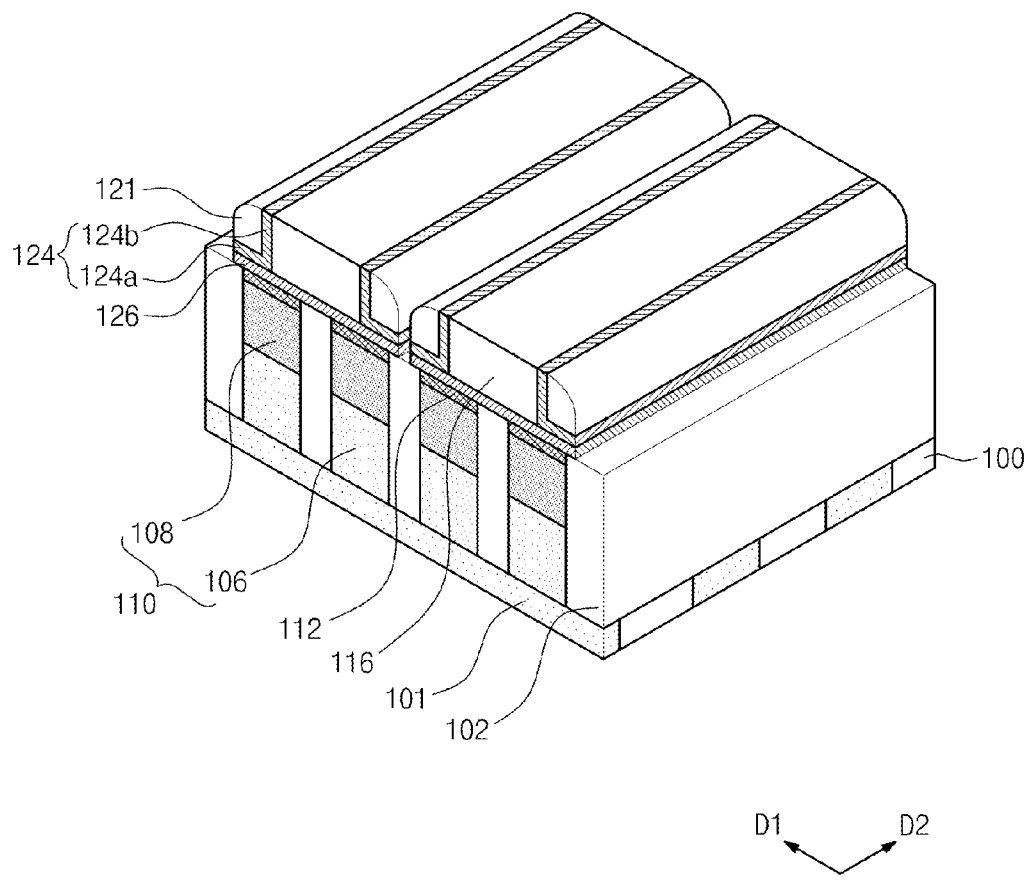

Referring to FIG. 11, preliminary first electrode patterns 124 and a first preliminary ohmic pattern 126 may be formed by etching the exposed first electrode layer 118 and ohmic layer 114 using the preliminary first spacer pattern 121 as an etch mask.

According to example embodiments of inventive concepts, the first preliminary ohmic pattern 126 may have a plate shape that partially covers at least a portion of the two select devices 110 and extends in the second direction D2.

Each of the preliminary first electrode patterns 124 extends in the second direction D2 and its section has an 'L' shape or a mirror image of an 'L'. As described in more detail, each of the preliminary first electrode patterns 124 may include a first portion 124a contacting the top of the first preliminary ohmic pattern 126 and a second portion extending from the first portion 124a and contacting a sidewall of the sacrificial pattern 116.

Figure 12:
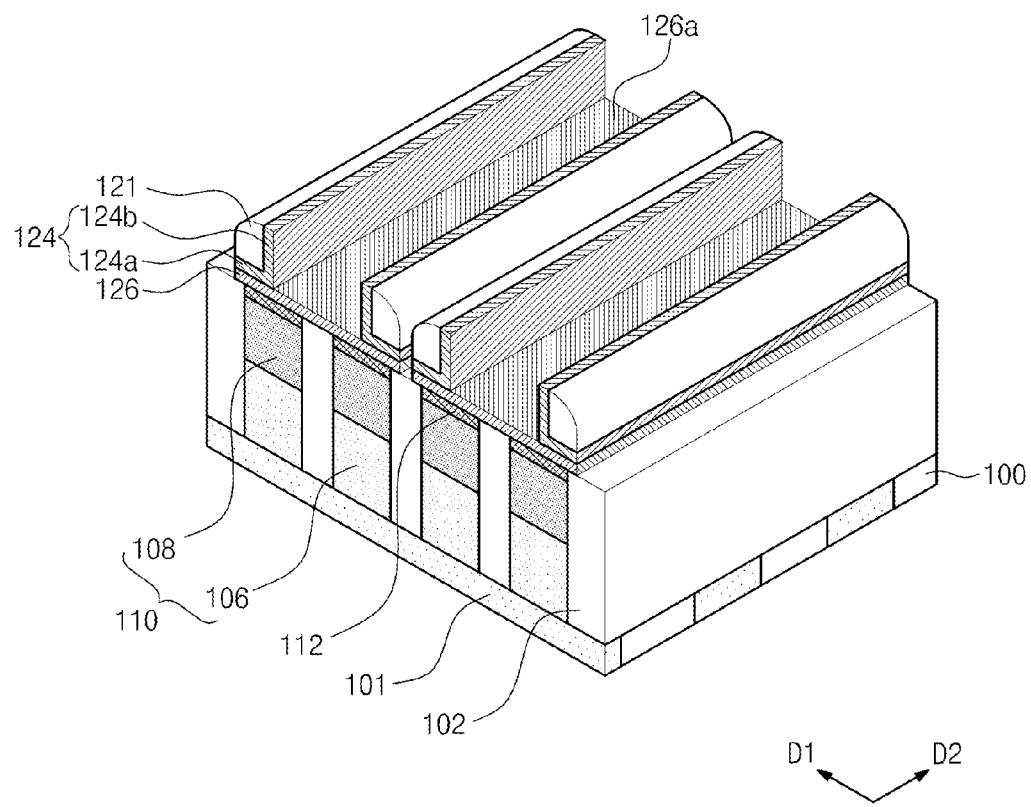

Referring to FIG. 12, the sacrificial pattern 116 may be removed.

According to example embodiments of inventive concepts, the sacrificial pattern 116 may be removed through wet etching using the etchant. As mentioned above, the sacrificial pattern 116 may have an etch selectivity with respect to the preliminary first electrode pattern 124 and the preliminary first spacer pattern 121 when the etchant is used. Accordingly, while the sacrificial pattern 116 is removed through wet etching using the etchant, the preliminary first electrode patterns 124 and the preliminary first spacer pattern 121 may not be substantially etched.

As the sacrificial pattern 116 is removed, the top 126a of the first preliminary ohmic pattern 126 and a sidewall of a second portion 124b of each preliminary first electrode pattern 124 may be exposed.

Figure 13:
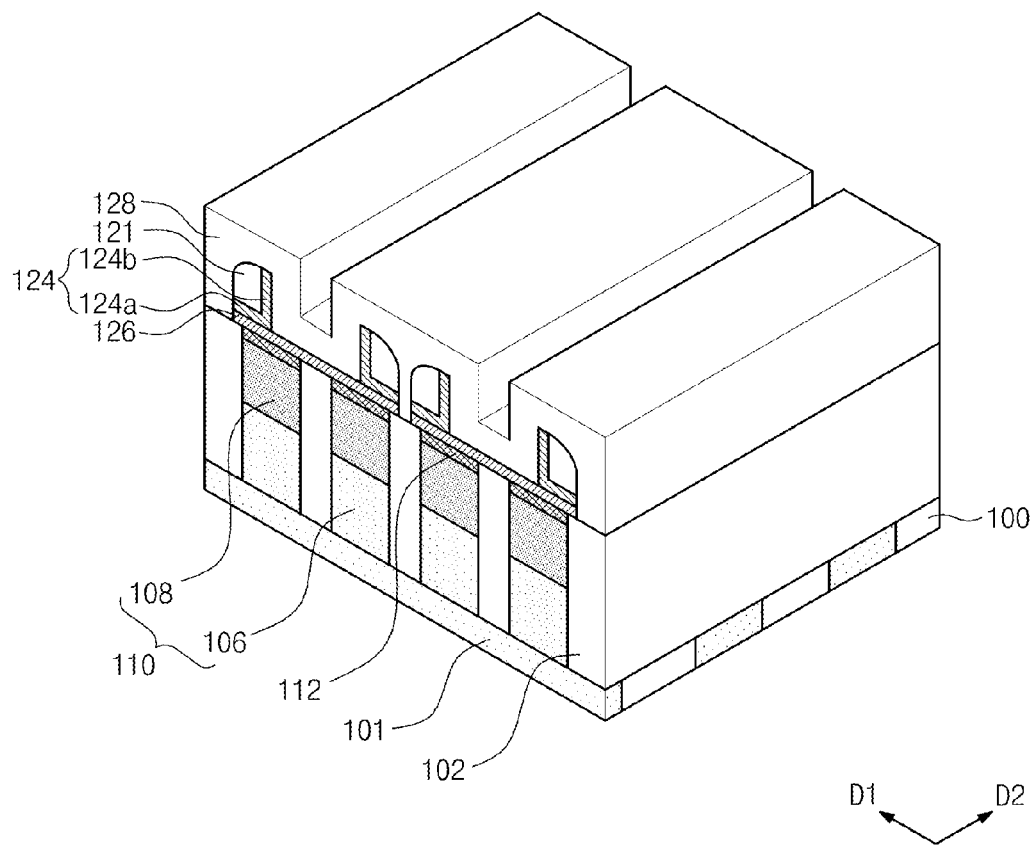

Referring to FIG. 13, a second spacer layer 128 may be conformally formed on the preliminary first spacer pattern 121, the preliminary first electrode patterns 124, and the first preliminary ohmic pattern 126.

The second spacer layer 128 may be continuously formed with the substantially same thickness along the surface profiles of the preliminary first spacer pattern 121, the preliminary first electrode patterns 124, and the first preliminary ohmic pattern 126.

According to example embodiments of inventive concepts, the second spacer layer 128 may substantially include the same material as the first spacer layer 120. For example, the second spacer layer 128 may include SiN, but example embodiments are not limited thereto.

Figure 14:
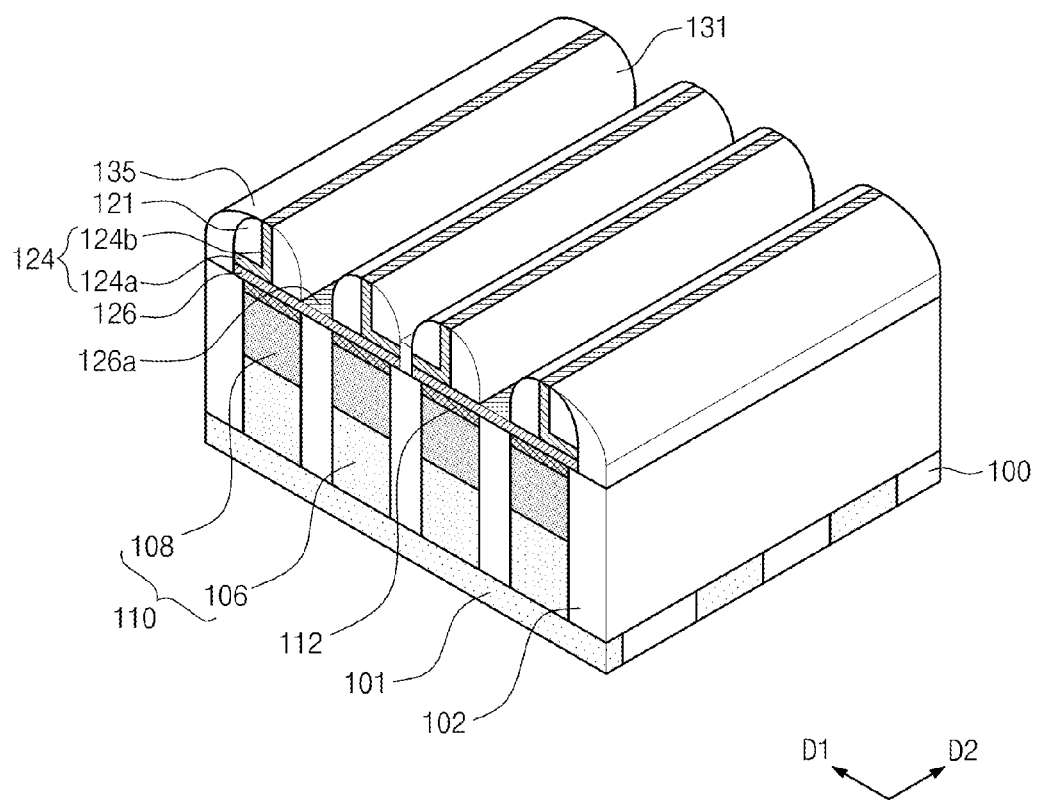

Referring to FIG. 14, a preliminary second spacer pattern 131 exposing the first preliminary ohmic pattern 126 partially may be formed by anisotropically etching the second spacer layer 128. A preliminary third spacer pattern 135 may also be formed on some of the preliminary first spacer patterns 121 by anisotropically etching the second spacer layer 128. For example, a preliminary third spacer pattern 135 may be formed on the preliminary spacer pattern 121 at the edges of the array where the first preliminary ohmic pattern 126 is not present, but example embodiments are not limited thereto.

As described in more detail, when the second spacer layer 128 is anisotropically etched, the second spacer layer 128 on the preliminary first spacer pattern 121 and the preliminary first electrode patterns 124 and the second spacer layer 128 on the second spacer layer 128 may be etched. During the etching, the second spacer layer 128 at a side of the second portion 124b of each preliminary first electrode pattern 124 may not be substantially etched. Additionally, the second spacer layer 128 formed at the side of each preliminary first spacer patterns 121, the sidewall of the second portion 124b of each preliminary first electrode pattern 124, and the side of the first preliminary ohmic pattern 126 may not be substantially etched. Accordingly, a preliminary third spacer pattern 135 may be formed on the outermost preliminary first spacer pattern 121 in the D1 direction. Additionally, preliminary second spacer pattern 131 may be formed on the sidewall of the second portion 124b of each preliminary first electrode pattern 124, and on a portion the first preliminary ohmic pattern 126.

As shown in the drawings, at least a portion of the top of the first preliminary ohmic pattern 126 may be exposed by the preliminary second spacer pattern 131. For example, the middle portion at the top 126a of the first preliminary ohmic pattern 126 may be exposed by the second spacers 130.

Figure 15:
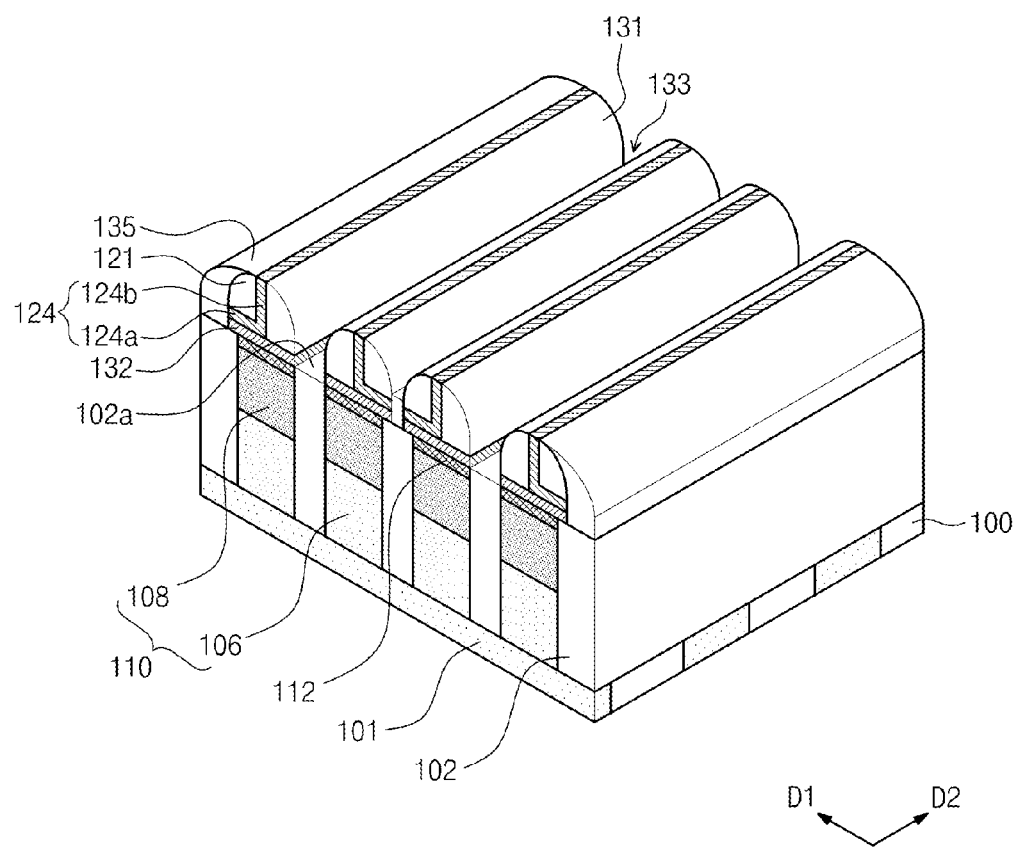

Referring to FIG. 15, second preliminary ohmic pattern 132 may be formed by etching the exposed first preliminary ohmic pattern 126 with the preliminary second spacer pattern 131 used as an etch mask.

Two second preliminary ohmic patterns 132 may be formed by etching the first preliminary ohmic pattern 126. Each second preliminary ohmic pattern 132 substantially has a smaller width than the first preliminary ohmic pattern 126 and may have a plate structure extending in the second direction D2. The width of the second preliminary ohmic pattern 132 may substantially be identical to or broader than that of the conductive pattern 112.

As shown in the drawings, each preliminary first electrode pattern 124 may be formed biased to one side of the top of each preliminary first electrode pattern 124. One end of the second portion 124b of the preliminary first electrode pattern 124 and one end of the second preliminary ohmic pattern 132 may be substantially disposed on the same plane. Additionally, the width of the second portion 124b of the preliminary first electrode pattern 124 may substantially be smaller than that of each second preliminary ohmic pattern 132. Additionally, the width of the second preliminary ohmic pattern 132 may substantially be identical to or substantially larger than that of the conductive pattern.

Figure 16:
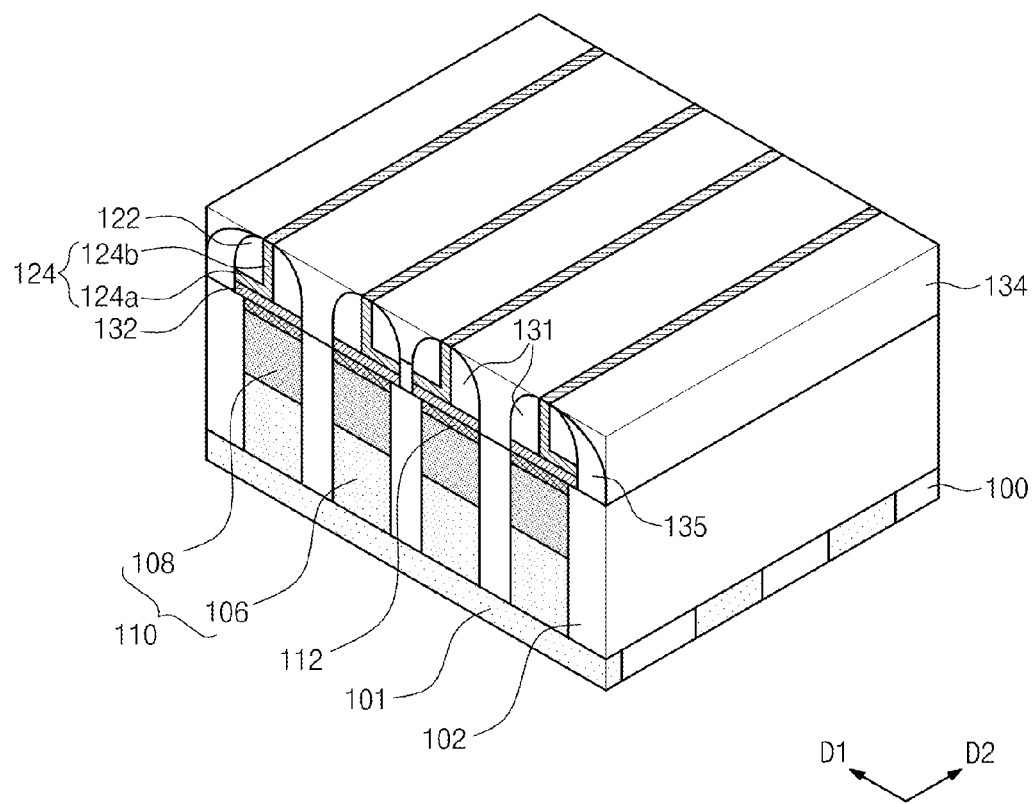

Referring to FIG. 16, a second insulation layer 134 may be formed on the first insulation layer 102 including the second preliminary ohmic patterns 132, the preliminary first electrode patterns 124, the preliminary first spacer pattern 121, and the preliminary second spacer pattern 131.

The second insulation layer 134 may be formed by filling between structures where the second preliminary ohmic pattern 132, the preliminary first electrode pattern 124, the preliminary first spacer pattern 121, and the preliminary second spacer pattern 131 are stacked. The thickness of the second insulation layer 134 may be adjusted using an etch back or planarizing process to expose a top surface of the first electrode pattern 138, but example embodiments are not limited thereto.

The second insulation layer 134 may include the same and/or substantially same material as the preliminary first pattern or preliminary second spacer pattern 121 and 131. For example, the second insulation layer 134 may include a silicon nitride. However, example embodiments of inventive concepts are not limited thereto. The second insulation layer 134 is not limited to the same and/or substantially the same material of the second insulation layer 134.

Figure 17:
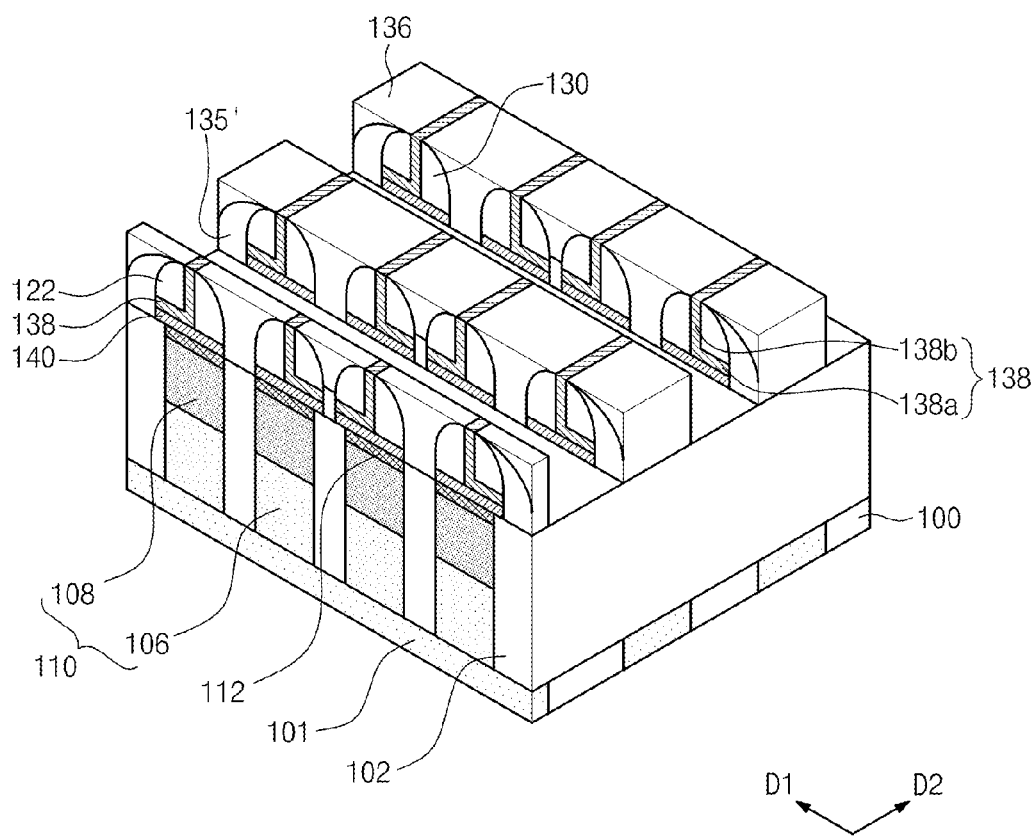

Referring to FIG. 17, first electrode patterns 138, first spacers 122, second spacers 130, third spacers 135', and ohmic patterns 140 may be formed by etching the preliminary first electrode patterns 124, preliminary first spacer patterns 121, preliminary second spacer patterns 131, preliminary third spacer patterns 135, and the second preliminary ohmic patterns 132 in the second direction D2.

As described in more detail, a line-shaped mask (not shown) extending in the second direction D2 may be formed on the second insulation layer 134. The second insulation layer 134, the preliminary second spacer pattern 130, the preliminary first spacer pattern 121, the preliminary first electrode patterns 124, and the second preliminary ohmic patterns 132 may be sequentially etched through an etching process using the mask. A second insulation pattern 136 extending from the first electrode patterns 138, the ohmic patterns 140, and the second insulation layer 134 in the first direction may be formed through the etching process.

Each first electrode pattern 138 may include a first portion 138a contacting each ohmic pattern 140 and a second portion 138b extending from the first portion 138a to the top and contacting the first spacer 122. This structural description will refer to FIGS. 2A and 2B.

Moreover, as shown in the drawings, each of the first electrode patterns 138 and the ohmic pattern 140 may be electrically connected to one select device 110.

Through an etching process using the sacrificial pattern 116, the first spacers 122, and the second spacers 130, described with reference to FIGS. 3 through 16, and an etching process described with reference to FIG. 17, each of the first electrode patterns 138 and the ohmic pattern 140 may be self-aligned and formed. Accordingly, a manufacturing process of the ohmic pattern 140 may be more simplified than a typical one.

Moreover, a typical ohmic pattern 140 is formed by applying a metal plug on a diode serving as the select device 110 and due to this, the length of the diode may be increased. However, if the ohmic pattern 140 is formed according to example embodiments, manufacturing the metal plug is omitted so that a diode that is substantially lower than a typical diode may be formed.

Figure 18:
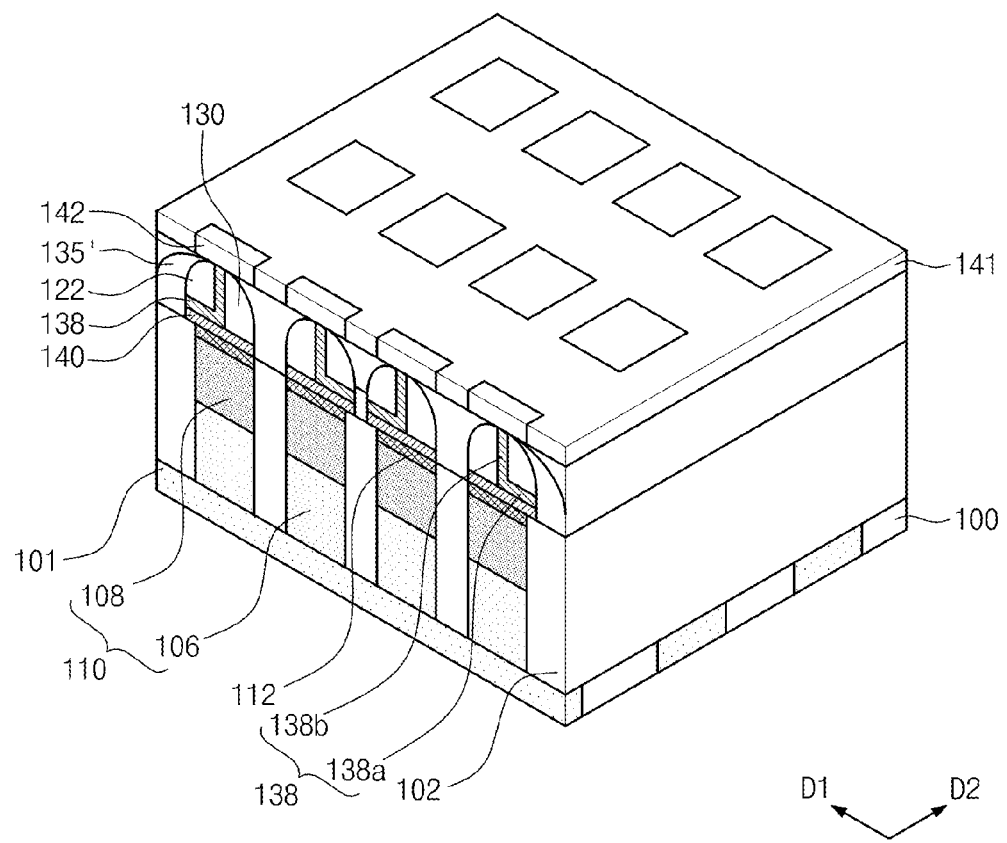

Referring to FIG. 18, a third insulation layer 141 having a variable resistance pattern 142 may be formed on the second insulation patterns 136. The third insulation layer 141 may be formed by filling between structures where the first spacers 122, the second spacers 130, the third spacers 135', the second insulation pattern 136, the first electrode patterns 138 and the ohmic patterns 140 are stacked.

The variable resistance pattern 142 that is electrically connected to each of the first electrode patterns 138 may be formed.

The third insulation layer 141 may be formed one of oxide, nitride and oxynitride. The third insulation layer may include first openings (not shown) to expose the first electrode patterns 138 respectively. The variable resistance patterns 142 may be formed by filling the first openings respectively. The variable resistance pattern 142 may be formed contacting the top surface of the first electrode patterns 138. The variable resistance pattern 142 may be formed of a compound including at least two of Te, Se, Ge, Sb, Bi, Pb, Sn, Ag, As, S, Si, P, O, and C, but example embodiments are not limited thereto.

Alternatively, according to example embodiment of inventive concepts, the resistance material pattern 142 may be formed by selectively recessing the first electrode patterns 138 and then filling the recessed portion.

Figure 19:
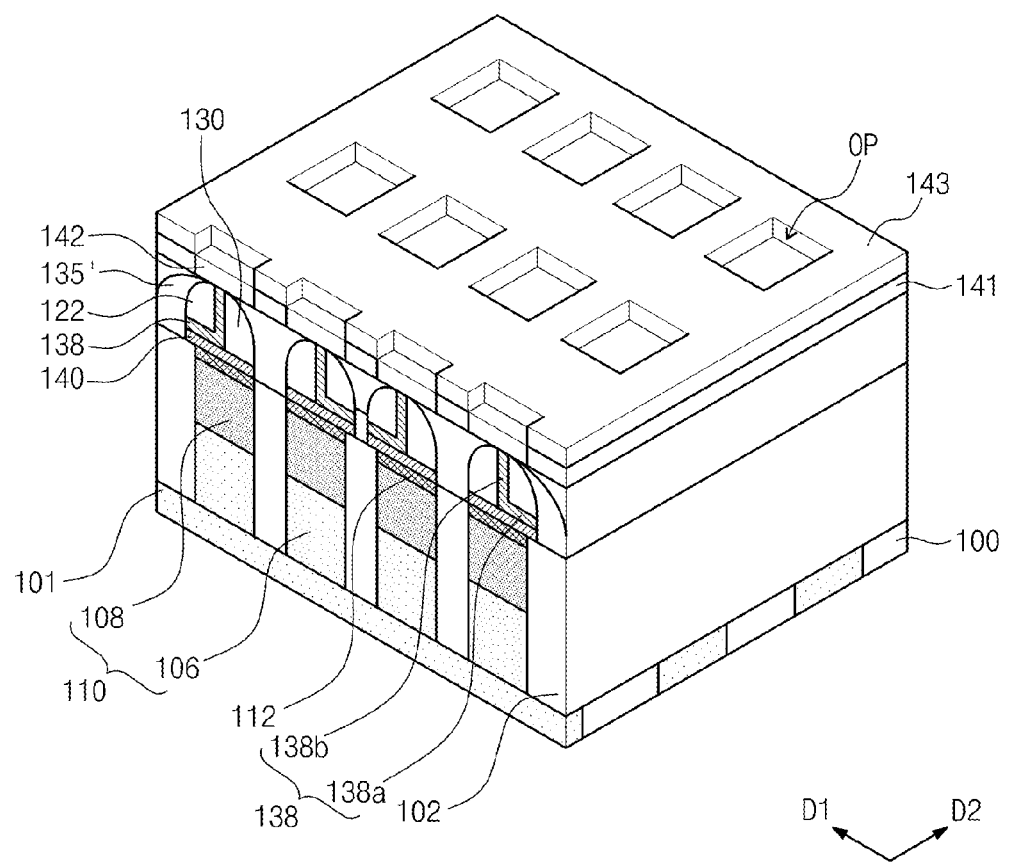

Referring to FIG. 19, a forth insulation layer 143 having openings OP may be formed on the third insulation layer 141 and the variable resistance pattern 142. The openings OP may expose the variable resistance patterns 142.

Figure 20:
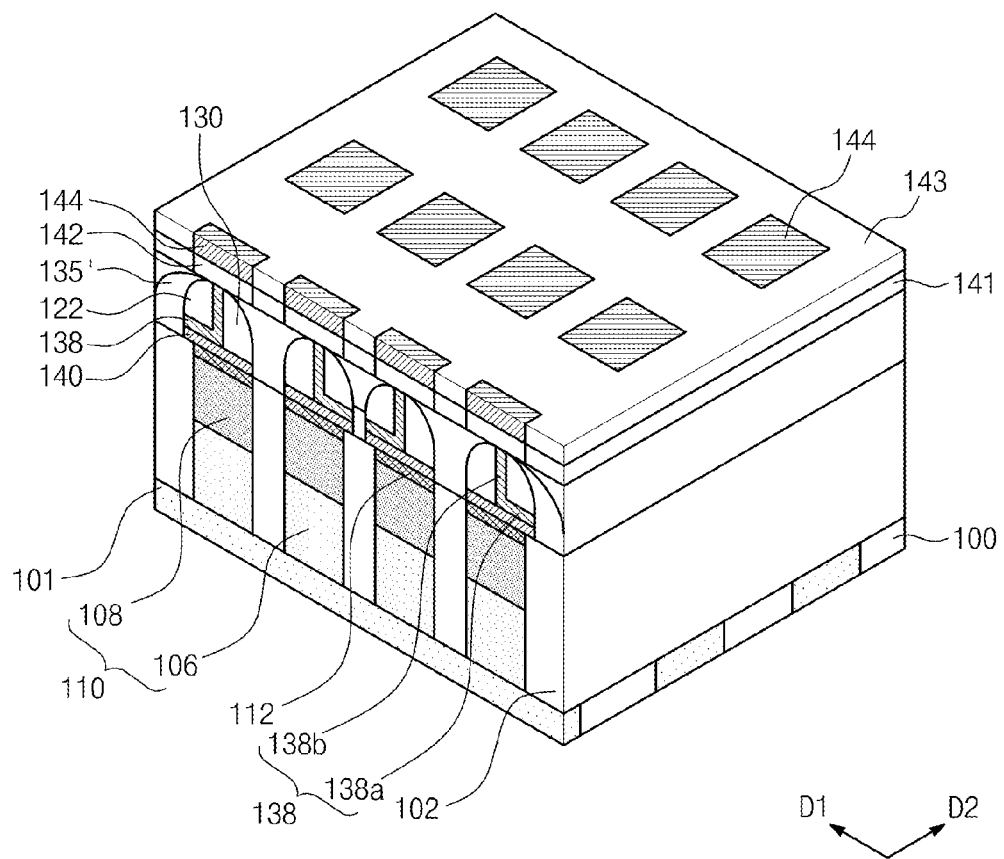

Referring to FIG. 20, the second electrode pattern 144 may be formed to be electrically connected to the variable resistance pattern 142 to fill the second opening OP. According to one aspect, a pattern formed of a conductive material that electrically connects the second electrode pattern 144 with the variable resistance pattern 142 may be further formed.

The second electrode pattern 144 may include a metal or a metal compound, but example embodiments are not limited thereto. For example, the second electrode pattern 144 may be formed of one of Ti, $TiSi_x$, TiN, TiON, TiW, TiAlN, TiAlON, TiSiN, TiBN, W, $WSi_x$, WN, WON, WSiN, WBN, WCN, Ta, $TaSi_x$, TaN, TaON, TaAlN, TaSiN, TaCN, Mo, MoN, MoSiN, MoAlN, NbN, ZrSiN, ZrAlN, Ru, CoSi, NiSi, a conductive C group, and combinations thereof, but example embodiments are not limited thereto.

Although now shown in detail, a bit line connected electrically to the second electrode pattern 144 and extending in the second direction D2 may be further formed. The bit line may be perpendicular to the word line 101.

(Application Example)

Figure 21:
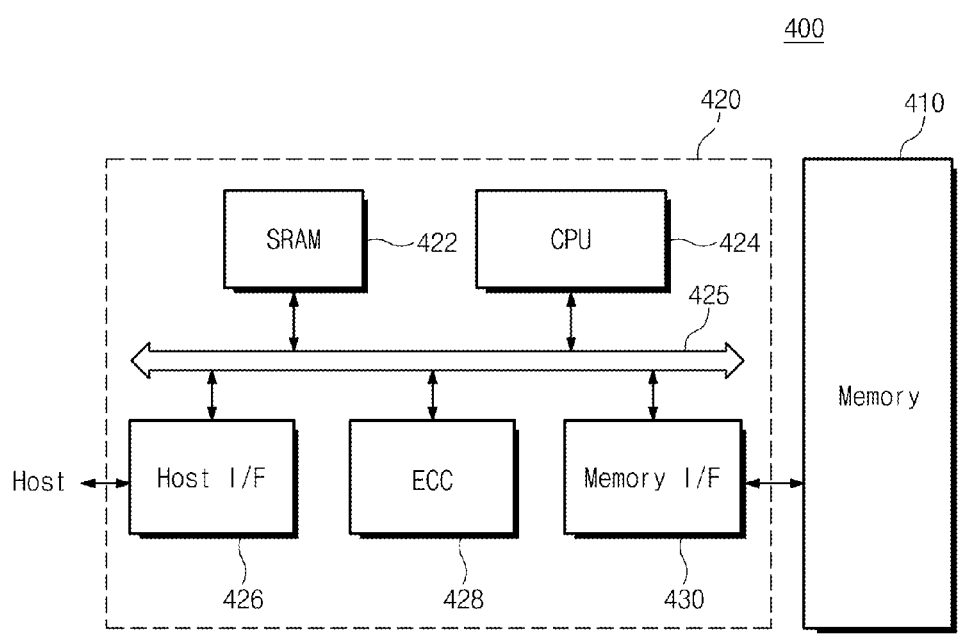
FIG. 21 is a block diagram illustrating a memory card with a memory device according to example embodiments of the inventive concepts.

FIG. 21 is a block diagram illustrating a memory card with a memory device according to example embodiments of inventive concepts.

Referring to FIG. 21, a variable resistance memory device according to example embodiments of inventive concepts may be applied to a memory card 400. As one example, the memory card 400 may include a memory controller 420 for providing general data exchanges between a host and a variable resistance memory device 410. An SRAM 422 may operate as an operating memory of the central processing unit (CPU) 424. A host interface (I/F) 426 may include a data exchange protocol of a host connected to the memory card 400. An Error Correction Code (ECC) 428 may detect and correct errors in data read from the resistive memory 410. The memory interface 430 interfaces with the resistive memory 210. The CPU 424 performs a general control operation for data exchanges of the memory controller 420. A bus 425 may operably connect the SRAM 422, CPU 424, host interface 426, ECC 428, and memory interface 430 together.

Since the resistive memory 410 applied to the memory card 400 includes a variable resistance memory device 410, an ohmic pattern and a first electrode pattern are self-aligned and thus manufacturing processes may be further simplified. Additionally, a select device of a variable resistance memory device 410 according to example embodiments of inventive concepts substantially has a lower height than a typical select device, so manufacturing processes may be performed easier.

Figure 22:
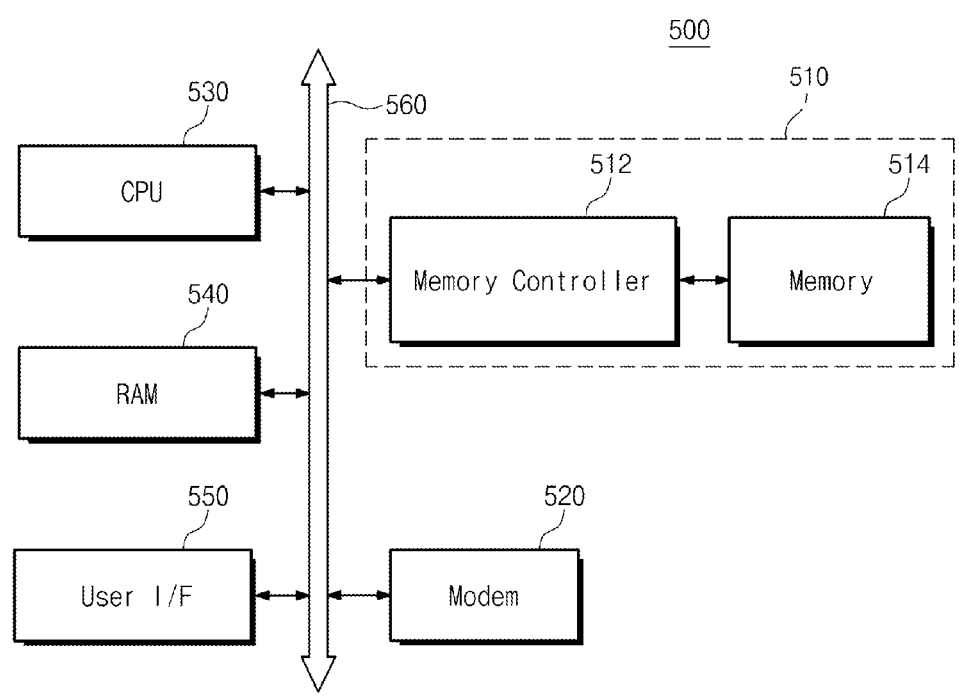
FIG. 22 is a block diagram illustrating an information processing system to which a memory device according to example embodiments of the inventive concepts is applied.

FIG. 22 is a block diagram illustrating an information processing system to which a memory device according to an embodiment of the inventive concept is applied.

Referring to FIG. 22, the information processing system 500 may include a memory system 510 equipped with a semiconductor memory device (e.g., a variable resistance memory 514) according to example embodiments of inventive concepts. The information processing system 500 may include a mobile device or a computer, but example embodiments are not limited thereto. As one example, the information processing system 500 may include a memory system 510, a modem 520, a CPU 530, a RAM 540, and a user interface (I/F) 550, which are electrically connected through a system bus 560. The memory system 310 may include data processed by the CPU 530 or data inputted from an external entity. The memory system 510 may include a variable resistance memory 5145 and a memory controller 514 and may have the same and/or substantially have the same configuration as the memory card 400 described with reference to FIG. 21. The information processing system 500 may be provided as a memory card, a solid state disk, a camera image sensor, and other application chipsets, but example embodiments are not limited thereto. As one example, the memory system 510 may include a semiconductor disk device (SSD) and in this case, the information processing system 500 may stably and reliably store high-capacity data in the memory system 510.

According to example embodiments of inventive concepts, one end of a first electrode pattern, one end of a spacer, and one end of an ohmic pattern are substantially disposed on the same plane, so that the first electrode pattern and the ohmic pattern may have a self-aligned structure.

Additionally, the first electrode pattern and the ohmic pattern may be formed through manufacturing processes using a sacrificial pattern, a first spacer, and a second spacer, in order to simplify processes for manufacturing a variable resistance memory device.

The above-disclosed subject matter is to be considered illustrative and not restrictive, and the appended claims are intended to cover all such modifications, enhancements, and other example embodiments, which fall within the true spirit and scope of the inventive concepts. Thus, to the maximum extent allowed by law, the scope of inventive concepts is to be determined by the broadest permissible interpretation of the following claims and their equivalents, and shall not be restricted or limited by the foregoing detailed description.

What is claimed is:
1. A method of manufacturing a variable resistance memory device, the method comprising:
 forming an ohmic layer on a substrate;
 forming a sacrificial pattern on the ohmic layer;
 forming a preliminary first electrode pattern,
  the preliminary first electrode pattern including a first portion and a second portion, the second portion of the preliminary first electrode pattern contacting a sidewall of the sacrificial pattern; and forming a preliminary ohmic pattern by removing a portion of the ohmic layer exposed by the sacrificial pattern and the preliminary first electrode pattern;

exposing a sidewall of the first electrode pattern by removing the sacrificial pattern,
the first portion of the preliminary first electrode pattern contacting the preliminary ohmic pattern;

forming a preliminary first spacer pattern on a sidewall of the preliminary first electrode pattern;

forming an ohmic pattern by etching the preliminary ohmic pattern; and forming a variable resistance pattern and a second electrode pattern on the ohmic pattern.

2. The method of claim 1, further comprising:
forming an insulation layer on the substrate, the insulation layer having a hole that exposes a top of the substrate;
forming a first semiconductor pattern doped with a first impurity having a first conductive type to partially fill the hole;
forming a second semiconductor pattern on the first semiconductor pattern to completely fill the hole,
the second semiconductor pattern doped with a second impurity of a second conductive type being different from the first conductive type;
forming a metal layer on the second semiconductor pattern and the insulation layer; and
thermally treating the second semiconductor pattern and the metal layer to transform a top of the second semiconductor pattern contacting the metal layer into a conductive pattern including a metal semiconductor compound.

3. The method of claim 2, wherein the forming of the preliminary first electrode pattern comprises:
conformally forming a first electrode layer on the ohmic layer and the sacrificial pattern;
forming a preliminary second spacer pattern on a sidewall of the sacrificial pattern having the first electrode layer; and
forming the preliminary first electrode pattern by etching the first electrode layer with the preliminary second spacer pattern used as an etch mask,
wherein the preliminary second spacer pattern is formed to cover a top of the conductive pattern formed at a bottom of the preliminary first electrode pattern.

4. The method of claim 1, wherein
the preliminary first spacer pattern is formed to cover a top of a conductive pattern formed at a bottom of the preliminary ohmic pattern.

5. The method of claim 1, wherein
the sacrificial pattern is formed of a material having an etch selectivity with respect to the preliminary first spacer pattern and the first electrode pattern when an etchant is used.

6. The method of claim 1, wherein the forming the ohmic layer includes:
sequentially stacking a metal layer and a metal compound layer.

7. A method of manufacturing a variable resistance memory device comprising:
forming an ohmic layer connected to at least one word line;
forming at least one sacrificial pattern on the ohmic layer;
forming a first electrode layer on the at least one sacrificial pattern and the ohmic layer;
forming at least one preliminary first spacer pattern on the first electrode layer and the ohmic layer;
forming at least one ohmic pattern by,
removing a first portion of the ohmic layer using at least the at least one preliminary first spacer pattern as a mask, and
removing a second portion of the ohmic layer under the at least one sacrificial pattern; and
forming at least one variable resistance pattern and at least one second electrode pattern on the at least one ohmic pattern.

8. The method of manufacturing a variable resistance memory device of claim 7, wherein the forming at least one preliminary first spacer pattern forms the at least one preliminary first spacer pattern so
the first electrode layer is between the at least one sacrificial pattern and the at least one preliminary first spacer pattern, and
the first electrode layer is between the ohmic layer and the at least one preliminary first spacer pattern.

9. The method of manufacturing a variable resistance memory device of claim 7, wherein the forming an ohmic layer connected to at least one word line includes:
forming at least one select device on the at least one word line; and
forming the ohmic layer on the at least one select device.

10. The method of manufacturing a variable resistance memory device of claim 7, wherein
the forming at least one ohmic pattern further includes,
forming at least one preliminary first electrode pattern by removing an exposed portion of the first electrode layer; and
the removing the second portion of the ohmic layer under the at least one sacrificial pattern includes,
removing the at least one sacrificial pattern,
forming at least one preliminary second spacer pattern on a sidewall of the preliminary first electrode pattern, and
removing the second portion of the ohmic layer using at least the at least one preliminary second spacer pattern as a mask.

11. The method of manufacturing a variable resistance memory device of claim 7, wherein
the forming at least one ohmic pattern further includes removing a third portion of the ohmic layer.

* * * * *